(12) United States Patent
Nikipelov et al.

(10) Patent No.: US 11,550,234 B2
(45) Date of Patent: Jan. 10, 2023

(54) OBJECT IN A LITHOGRAPHIC APPARATUS

(71) Applicant: ASML NETHERLANDS B.V., Veldhoven (NL)

(72) Inventors: Andrey Nikipelov, Eindhoven (NL); Johan Franciscus Maria Beckers, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/279,133

(22) PCT Filed: Sep. 25, 2019

(86) PCT No.: PCT/EP2019/075801
§ 371 (c)(1),
(2) Date: Mar. 24, 2021

(87) PCT Pub. No.: WO2020/069931
PCT Pub. Date: Apr. 9, 2020

(65) Prior Publication Data
US 2021/0397100 A1    Dec. 23, 2021

(30) Foreign Application Priority Data

Oct. 1, 2018   (EP) ..................... 18197937

(51) Int. Cl.
*G03F 7/20* (2006.01)
*C23C 16/40* (2006.01)
*C23C 14/08* (2006.01)

(52) U.S. Cl.
CPC ............ *G03F 7/7095* (2013.01); *C23C 14/08* (2013.01); *C23C 16/401* (2013.01); *G03F 7/7085* (2013.01); *G03F 7/70341* (2013.01)

(58) Field of Classification Search
CPC ..... C23C 14/08; C23C 14/082; C23C 16/401; C23C 16/404; C23C 28/00; C23C 28/04;
(Continued)

(56) References Cited

U.S. PATENT DOCUMENTS

2004/0207824 A1   10/2004 Lof et al.
2006/0291060 A1   12/2006 Shirai et al.
(Continued)

FOREIGN PATENT DOCUMENTS

CN    101276158 A    * 10/2008    ............... G03F 7/11
EP    1420298         5/2004
(Continued)

OTHER PUBLICATIONS

Machine translation of CN-101276158-A.*
(Continued)

*Primary Examiner* — Deoram Persaud
(74) *Attorney, Agent, or Firm* — Pillsbury Winthrop Shaw Pittman LLP (57) ABSTRACT

An object, such as a sensor for an immersion lithographic apparatus, has an outer layer which comes in contact with immersion liquid and wherein the outer layer has a composition including a rare earth element. There is also provided an immersion lithographic apparatus having such an object and a method for manufacturing such an object.

20 Claims, 6 Drawing Sheets

(58) Field of Classification Search
CPC ... G03F 7/70341; G03F 7/7085; G03F 7/7095
See application file for complete search history.

(56) References Cited

U.S. PATENT DOCUMENTS

| | | | |
|---|---|---|---|
| 2011/0135839 A1 | 6/2011 | Dziomkina | |
| 2020/0064183 A1* | 2/2020 | Klugkist | G01J 1/429 |
| 2021/0132517 A1* | 5/2021 | Nikipelov | G03F 9/7076 |
| 2022/0163896 A1* | 5/2022 | Banerjee | C23C 14/34 |

FOREIGN PATENT DOCUMENTS

| | | |
|---|---|---|
| EP | 1672680 | 6/2006 |
| JP | 2000281971 | 10/2000 |
| JP | 2005263741 | 9/2005 |
| JP | 2009020333 | 1/2009 |
| JP | 2010087531 | 4/2010 |
| JP | 2017526009 | 9/2017 |
| WO | 2013141877 | 9/2013 |

OTHER PUBLICATIONS

International Search Report and Written Opinion issued in corresponding PCT Patent Application No. PCT/EP2019/075801, dated Jan. 7, 2020.
Lafferty, N. et al.: "Mask Enhancement Using an Evanescent Wave Effect", Proc. of SPIE, vol. 6520, Mar. 29, 2007.
Japanese Office Action issued in corresponding Japanese Patent Application No. 2021-516771, dated Jun. 7, 2022.

* cited by examiner

OBJECT IN A LITHOGRAPHIC APPARATUS

CROSS-REFERENCE TO RELATED APPLICATIONS

This application is the U.S. national phase entry of PCT Patent Application No. PCT/EP2019/075801, which was filed on Sep. 25, 2019, which claims the benefit of priority of European Patent Application No. 18197937.8, which was filed on Oct. 1, 2018 and which is incorporated herein in its entirety by reference.

FIELD

The present invention relates to an object in a lithographic apparatus in which the object has a layer applied to it. The present invention relates in particular to a sensor mark for a sensor for a lithography apparatus and a method of manufacturing a device using a lithography apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

To project a pattern on the substrate the lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on the substrate than a lithographic apparatus which uses, for example, radiation with a wavelength of 193 nm.

In an immersion lithography apparatus, a liquid is confined to an immersion space by a liquid confinement structure. The immersion space is between a final optical element of a projection system through which the pattern is imaged and the substrate onto which the pattern is transferred or a substrate table on which the substrate is held. The liquid may be confined to the immersion space by a fluid seal. The liquid confinement structure may create or use a flow of gas, for example to help in controlling the flow and/or the position of the liquid in the immersion space. The flow of gas may help form the seal to confine the liquid to the immersion space. At least part of the substrate support table is coated with a coating with limited hydrophilicity to reduce liquid loss due to motion of the substrate support table with respect to the final optical element. At least part of sensors that are integrated into substrate support table is coated with a coating with limited hydrophilicity to reduce liquid loss and to reduce heat load by remaining liquid evaporation.

Immersion lithograph apparatus rely on several sensors integrated into the support table which supports the substrate. These sensors are used for:

substrate/support table alignment with respect to a reference frame;

lens (re)adjustment, setup, heating compensation; and reticle (mask) heating compensation.

Sensors' marks are integrated into a stack of thin film layers which is deposited on a transparent (quartz) plate built into the support table and act as:

spatial transmission filters for DUV (Integrated Lens Interferometry At Scanner "ILIAS" sensor, Parallel ILIAS sensor (PARIS), Transmission Image Sensor "TIS" sensor functionality).

spatial reflective filters for Visible Radiation "VIS", Near Infra Red "NIR", Mid-Infra Red "MIR" (Smart Alignment Sensor Hybrid "SMASH" sensor functionality).

The reflection from the top surface of the stack (mark-free region) is used for the level sensor.

Upper hydrophobic layers (e.g. a layer with limited hydrophilicity) suffer from degradation, for example due to exposure to deep ultra violet radiation.

Hydrophobic layers (e.g. layers with limited hydrophilicity) are applied to other objects in a lithographic apparatus. Indeed many objects in a lithographic apparatus have a coating or layer applied thereon. It can be difficult to prevent a coating or layer from degrading.

Degrading of a coating or layer is undesirable for many reasons including the undesirable generation of particles which can introduce imaging errors if they find their way into a beam path for imaging the substrate or a sensor as well as the fact that the property desired by the presence of the coating or layer (e.g. hydrophobic) is no longer present once the coating or layer has degraded.

SUMMARY

It is desirable, to provide an object in a lithographic apparatus with an outer layer (e.g., coating) which has improved resistance to degradation, for example, to provide a sensor mark with improved hydrophobic (e.g. limited hydrophilicity) coating resistance to degradation.

According to an aspect, there is provided an immersion lithographic apparatus comprising: an object, the object comprising: a substrate and an outer layer, the outer layer, in use, coming in contact with immersion liquid, wherein the outer layer has a composition comprising a rare earth element.

According to an aspect, there is provided an object for a lithographic apparatus comprising: a substrate and an outer layer, wherein water makes a receding contact angle of at least 75° with the outer layer; and the outer layer has a composition comprising a rare earth element.

According to the aspect, there is provided a method of coating a substrate comprising: providing a substrate; depositing on the substrate an outer layer which has a composition comprising a rare earth element by at least one of: (a) sputtering, wherein at least one sputtering target material comprises rare earth element, and (b) PVD and/or CVD and/or ALD, wherein at least one of precursors/reactive gases comprises rare earth element, and (c) plasma induced (co)polymerization, and (d) ion implantation, where ion source is metal vapour arc source, and vapor at least partly comprises rare earth.

According to an aspect, there is provided a method of coating a substrate comprising: providing a substrate; exposing the substrate to an oxidising atmosphere containing a compound of a rare earth element in volatile form and an inorganic/organosilicon polymer precursor thereby to deposit an outer layer on the substrate which comprises co-polymerized and/or covalently bonded inorganic monomers and a rare earth element.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
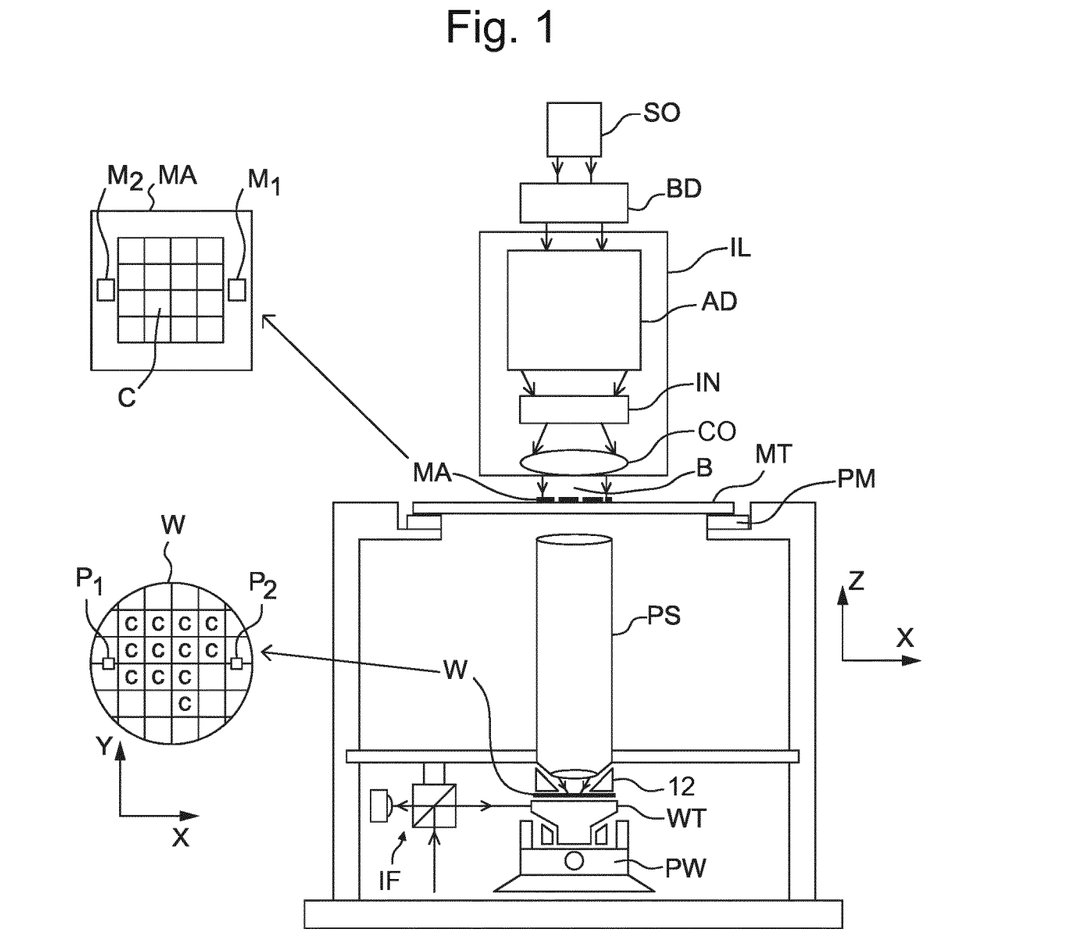
FIG. 1 schematically depicts a lithography apparatus.

FIG. 1 schematically depicts a lithographic apparatus of an embodiment. The apparatus comprises:

optionally, an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table or wafer table WT constructed to hold a substrate (e.g. a resist-coated production substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g.

comprising part of, one, or more dies) of the substrate W.

The lithographic apparatus may be of a type wherein at least a portion of the substrate W may be covered by an immersion liquid having a relatively high refractive index, e.g. water such as ultra pure water (UPW), so as to fill an immersion space between the projection system PS and the substrate W. An immersion liquid may also be applied to other spaces in the lithography apparatus, for example, between the patterning device MA and the projection system PS Immersion techniques can be used to increase the numerical aperture of projection systems. The term "immersion" as used herein does not mean that a structure, such as a substrate W, must be submerged in immersion liquid; rather "immersion" only means that an immersion liquid is located between the projection system PS and the substrate W during exposure. The path of the patterned radiation beam B from the projection system PS to the substrate W is entirely through immersion liquid. In an arrangement for providing immersion liquid between a final optical element of the projection system PS and the substrate W a liquid confinement structure extends along at least a part of a boundary of an immersion space between the final optical element of the projection system PS and the facing surface of the stage or table facing the projection system PS.

In operation, the illuminator IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system".

The lithographic apparatus may be of a type having two or more support tables, e.g., two or more support tables or a combination of one or more support tables and one or more cleaning, sensor or measurement tables. For example, the lithographic apparatus is a multi-stage apparatus comprising two or more tables located at the exposure side of the projection system, each table comprising and/or holding one or more objects. In an example, one or more of the tables may hold a radiation-sensitive substrate. In an example, one or more of the tables may hold a sensor to measure radiation from the projection system. In an example, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In operation, the radiation beam B is incident on the pattern (design layout) present on patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B at a focused and aligned position. Similarly, the first positioner PM and another position sensor (which is not explicitly depicted in FIG. 1) can be used to accurately position the patterning device MA with respect to the path of the radiation beam B. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C (these are known as scribe-lane alignment marks).

Figure 2:
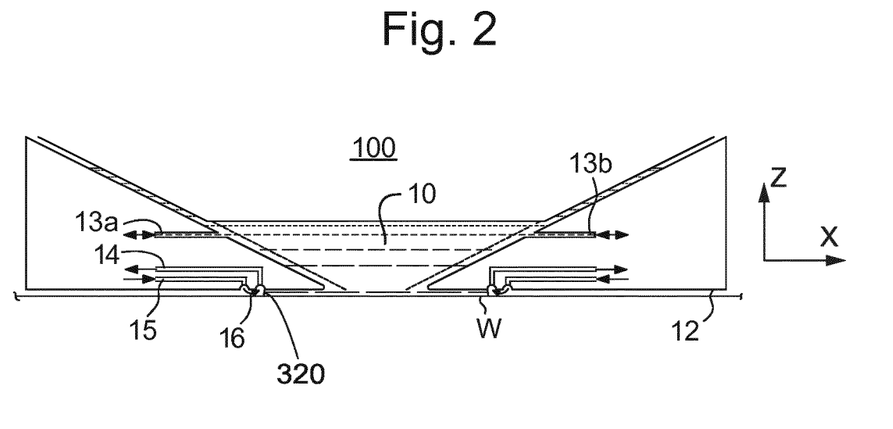
FIG. 2 schematically depicts a liquid confinement structure for use in the lithographic apparatus.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab. In an arrangement which has been proposed for a localized immersion system a liquid confinement structure 12 extends along at least a part of a boundary of an immersion space 10 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, support table WT, e.g. the substrate table which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 10 between the final optical element 100 of the projection system PS and the support table WT or substrate W. In an embodiment, a seal is formed between the liquid confinement structure 12 and the surface of the substrate W/support table WT. The seal may be a contactless seal such as a gas seal 16 (such a system with a gas seal is disclosed in European patent application publication no. EP-A-1,420, 298) or a liquid seal.

The liquid confinement structure 12 is configured to supply and confine immersion fluid, e.g., liquid, to the immersion space 10 Immersion fluid is brought into the immersion space 10 through one of liquid openings, e.g., opening 13a. The immersion fluid may be removed through one of liquid openings, e.g., opening 13b. The immersion fluid may be brought into the immersion space 10 through at least two liquid openings, e.g., opening 13a and opening 13b. Which of liquid openings is used to supply immersion fluid and optionally which is used to remove immersion liquid may depend on the direction of motion of the support table WT.

Immersion fluid may be contained in the immersion space 10 by the gas seal 16 which, during use, is formed between the bottom of the liquid confinement structure 12 and the facing surface of the table (i.e. the surface of the substrate W and/or the surface of the support table WT). The gas in the gas seal 16 is provided under pressure via gas inlet 15 to a gap between the liquid confinement structure 12 and substrate W and/or support table WT. The gas is extracted via a channel associated with gas outlet 14. The overpressure on the gas inlet 15, vacuum level on the gas outlet 14 and geometry of the gap are arranged so that there is a high-velocity gas flow inwardly that confines the immersion fluid. The force of the gas on the immersion fluid between the liquid confinement structure 12 and the substrate W and/or support table WT contains the immersion fluid in the immersion space 10. A meniscus 320 forms at a boundary of the immersion fluid. Such a system is disclosed in United States patent application publication no. US 2004-0207824. Other liquid confinement structures 12 can be used with embodiments of the present invention.

The surfaces of many objects of a lithographic apparatus have a coating or layer applied thereon. The coating can have one or more purposes. Example purposes of a coating in a lithographic apparatus include positional control of immersion liquid, prevention of certain materials coming into contact with immersion liquid, absorption, transmission or reflection of a beam of radiation. The present invention can be applied to any outer layer which is present on an object.

The object itself may act as a substrate (i.e. a supporting underlying substance or layer as opposed to a wafer, sometimes also referred to as a substrate in a different context, on which a device is formed) for the outer layer or the object may have one or more lower layers under the outer layer. The lower layer is not necessarily the layer directly on the substrate, but is lower with respect to the outer layer. The lower layer is between the substrate and the outer layer.

In the present invention an intermediate layer (sometimes referred to as an interface layer) may be positioned between the outer layer and the substrate or lower layer, if the lower layer is present.

The present invention will be described below in detail with reference to a sensor mark which comprises a substrate of quartz, one or more lower layers for interaction with a beam of radiation and, an outer layer with limited hydrophilicity (sometimes called a hydrophobic coating or a coating), for example with which water has a receding contact angle of at least 75°, preferably of at least 90°.

Figure 3:
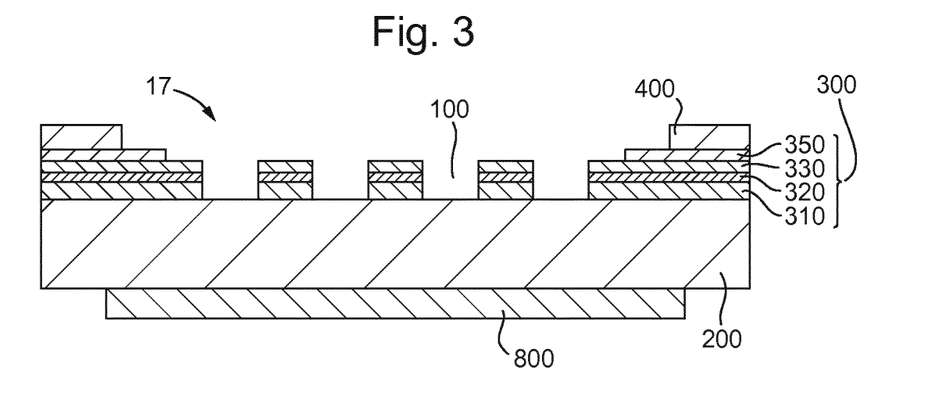
FIG. 3 is a cross-sectional view through a conventional transmissive sensor mark.
Figure 4:
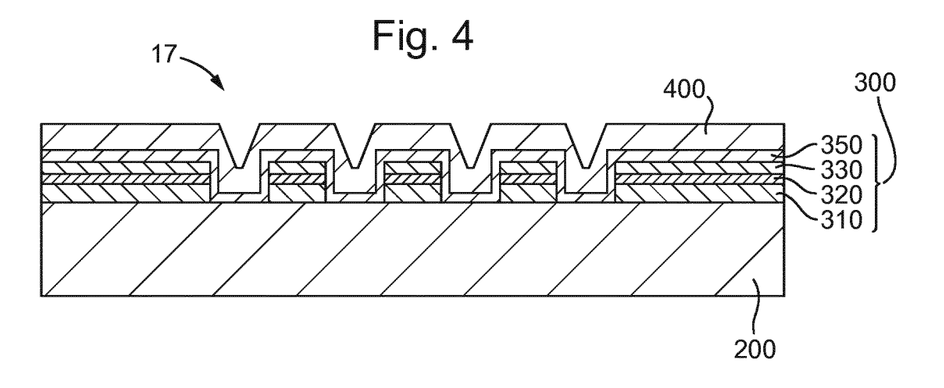
FIG. 4 is a cross-sectional view through a conventional reflective sensor mark.
Figure 5:
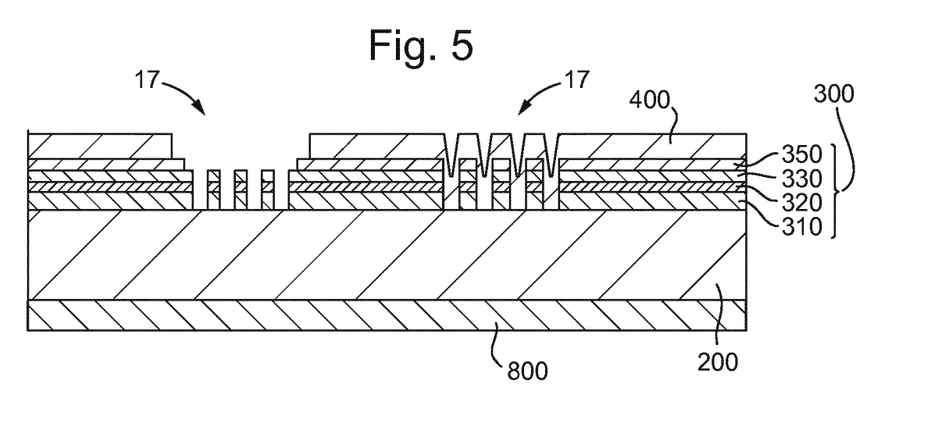
FIG. 5 shows the sensor marks of FIGS. 3 and 4 in a single quartz plate.

FIGS. 3, 4 and 5 illustrate a sensor mark of the prior art formed on a substrate, e.g., quartz ($SiO_2$) plate 200. Sensor's marks are integrated into a stack 300 of thin films which is deposited on top of the quartz plate 200. The quartz plate 200 is integrated into the support table WT. The stack 300 of thin films may comprise any number of layers. As illustrated in FIGS. 3, 4 and 5 the stack 300 comprises four layers, layers 310, 320 and 330 are layers for absorbing DUV radiation projected onto the sensor mark from above, as illustrated, and for absorbing radiation from underneath the quartz plate 200 which might be emitted by a material 600 under the quartz plate 200 which emits visible light when irradiated by DUV radiation. A lower layer 350 (lower with respect to an outer layer 400) is formed on top of the layers 310, 320, 330 of the stack 300. In an embodiment, the lower layer 350 is reflective to VIS and/or NIR and/or MIR radiation.

To provide some of the measurements the sensors pass under the liquid confinement structure 12 and so sensor marks get covered in immersion liquid. After these measurement sensors pass under the liquid confinement structure 12 again and are removed from immersion liquid. To avoid liquid being left behind on the sensor marks or on the stack 300 around marks, the outer layer 400 with limited hydrophilicity is applied to the sensor mark and/or around the sensor mark.

The purpose of these layers and their manufacture will now be described in more detail following an explanation of the use of the sensor mark in a lithographic apparatus.

Sensor marks act as:
spatial transmission filters for deep ultra violet (DUV) (PARIS, ILIAS, TIS functionality); and
spatial reflective filters for VIS, NIR, MIR (SMASH functionality).

Also, the reflection from the top surface of the stack 300 (mark-free region) can be used by other sensors.

Currently sensor marks are produced via the following sequence, with reference to FIG. 3:

1) A continuous layer of Blue Chrome (CrOx—Cr—CrOx) 310, 320, 330, with a total thickness of ~100 nm (e.g. 50-200 nm), is deposited on the quartz plate 200. Blue Chrome 310, 320, 330 is required to minimize secondary reflections of visible light from the material 600 placed under the quartz plate 200. This material 600 converts DUV to visible light, which is captured by a sensor. DUV from the projection system PS passes through holes 100 patterned in the Blue Chrome 310, 320, 330. Composition for CrOx is either $Cr_2O_3$, $CrO_xN_y$, or $CrO_xN_yC_z$. The layers within Blue Chrome 310, 320, 330 are: bottom 310 $CrO_x$=10-80 nm thick; middle 320 Cr=5-60 nm thick; and top 330 $CrO_x$=20-100 nm thick.

2) A pattern for PARIS/ILIAS/TIS/SMASH marks (1D and 2D gratings) and other marks are lithographically-deposited and then etched in Blue Chrome 310, 320, 330 until quartz surface is exposed (it acts as etch-stop). Through holes 100 form the pattern.

3) A layer 350 of TiN with total thickness of up to 300 nm or less than 100 nm is deposited on top of Blue Chrome 310, 320, 330 and quartz plate 200, it conforms to the pattern. This layer 350 will provide marks for measurements via reflection of VIS/NIR/MIR, without light leaking through quartz (VIS/IR/DUV) through these marks. This layer can be seen as a radiation blocking layer.

4) An outer layer 400 of coating with limited hydrophilicity (e.g. an inorganic polymer with for example a Si—O—Si—O backbone preferably with methyl groups such as Lipocer®) is applied on top of the (lower) layer 350. Below Lipocer is referred to (but this is not intended to be limiting). For instance, the outer layer 400 may comprise any inorganic and/or organosilicon polymer. The polymer may have one or more groups selected from: methyl, ethyl, propyl, phenyl, vinyl. Lipocer is deposited on the lower (TiN) layer 350, which minimizes water loss, during the times the support table WT with sensor moves from under liquid confinement structure 12. The outer (Lipocer) layer typically has a thickness of 1-300 nm, but can be more, e.g. up to 500 nm.

5) In some spots on the sensor plate, where a high DUV dose is expected due to measurement procedure, Lipocer is not present e.g. removed (typically, a spot is ~100×100 $nm^2$ but it may also be larger, e.g. ~2×2 $cm^2$).

Some spots will also be stripped of TiN, so to allow DUV passing to the quartz plate 200 surface through holes 100 in Blue Chrome 310, 320, 330. Such spots are normally over TIS, ILIAS and PARIS (referring to FIG. 3).

In FIGS. 3 and 4:
Gratings are not in scale, the typical tile size (i.e. the size of the squares of the pattern), line width of grating is 1-10 um.
DUV (projected through reticle marks and lens) passes through holes 100 in the Blue Chrome 310, 320, 330.
IR/VIS (from the source of SMASH measurement system) is mostly reflected from the interface Lipocer/TiN; some reflection can also occur at the interface TiN/Blue Chrome.
Level sensor is based on reflection from Lipocer and/or from TiN.

FIG. 3 represents a PARIS stack (and ILIAS). FIG. 4 represents a SMASH stack. FIG. 5 shows the PARIS and SMASH marks produced in the same manufacturing sequence, on the shared quartz plate 200.

To prevent galvanic corrosion of Cr (which forms a pair with stainless steel of the liquid confinement structure 12), the whole sensor mark may be biased with respect to the grounded liquid confinement structure 12.

An outer layer 400 which is made of Lipocer suffers degradation in a lithographic apparatus. The degradation is due to direct and scattered irradiation by DUV. As a result of the irradiation by DUV (directly or indirectly) Lipocer becomes more hydrophilic. It is thought that the reduction in hydrophobicity is due to cleaving of $CH_3$ groups resulting in a situation where water containment cannot be guaranteed any longer. Water can remain on the sensor mark. Water remaining on the sensor mark can result in focus errors due to level sensor misreading or droplets or contamination left behind. Drying droplets can result in temperature fluctuations of the sensor mark because of evaporating liquid thereby leading to sensor defamations. It is thought that high energy photons from DUV radiation are able to break molecule chains and cause methane groups to leave the Lipocer. The reaction leaves in place of the methyl group hydroxyl end-groups which are hydrophilic.

Additionally or alternatively exposure to DUV as well as irradiation from sensors (in particular the SMASH laser) can cause shrinkage of the Lipocer layer. This shrinkage can lead to opening tears in the Lipocer layer. Thus any TiN under a tear in the layer 350 can be oxidised. Oxidised TiN absorbs DUV radiation and thereby can accelerate the degradation process due to temperature fluctuation. Oxidised TiN can cause unacceptable drifts in sensor read out.

The above two mentioned problems are primarily associated with deterioration of Lipocer due to exposure to water and DUV radiation. The deterioration is either caused by oxidation or shrinking. The shrinking is the result of removal of relatively large methyl (non-polar) groups which are replaced with smaller hydroxyl (—OH) groups which are polar and so this also induces extra stress by interacting with other polar groups in the environment.

In the present invention the outer layer has a composition comprising a rare earth element. The present inventors have found that due to elongated bond lengths formed with the rare earth element (for example a rare earth element-oxygen bond) that such an outer layer is hydrophobic and is also more robust in a water environment with DUV radiation. Such a coating is also transparent to DUV radiation.

The large interatomic distance between the rare earth element and oxygen (or other elements, for example C, Si, B, N) means that the hydrophobicity has a different source compared to Lipocer. In Lipocer it is the presence of methyl, ethyl, propyl, phenyl or vinyl groups which results in the hydrophobicity. However when a rare earth element is used in the outer layer 400 the hydrophobicity is caused by the large interatomic distances. In contrast to Lipocer where the polarity of the methyl groups results in the hydrophobicity, the hydrophobicity of rare earth element oxides (or, by extension carbides, silicides, nitrides and borides) is a result of the size and shape of cells within the crystal lattices. Therefore in contrast to Lipocer oxidation or replacement of methyl groups with a hydroxide group does not deleteriously affect the hydrophilicity of the layer. Such a layer is able to interact with water to give a receding contact angle of at least 75°, even at least 90°.

The rare earth element may be bonded to oxygen atoms (at least partly oxidized) when the outer layer is first prepared. Alternatively or additionally the rare earth element may bond to oxygen atoms during use. Alternatively or additionally the rare earth element may be partly nitridized, borodized, carbonated or silicized before or during use and such compounds show similar attributes to rare earth element oxides.

Figure 8:
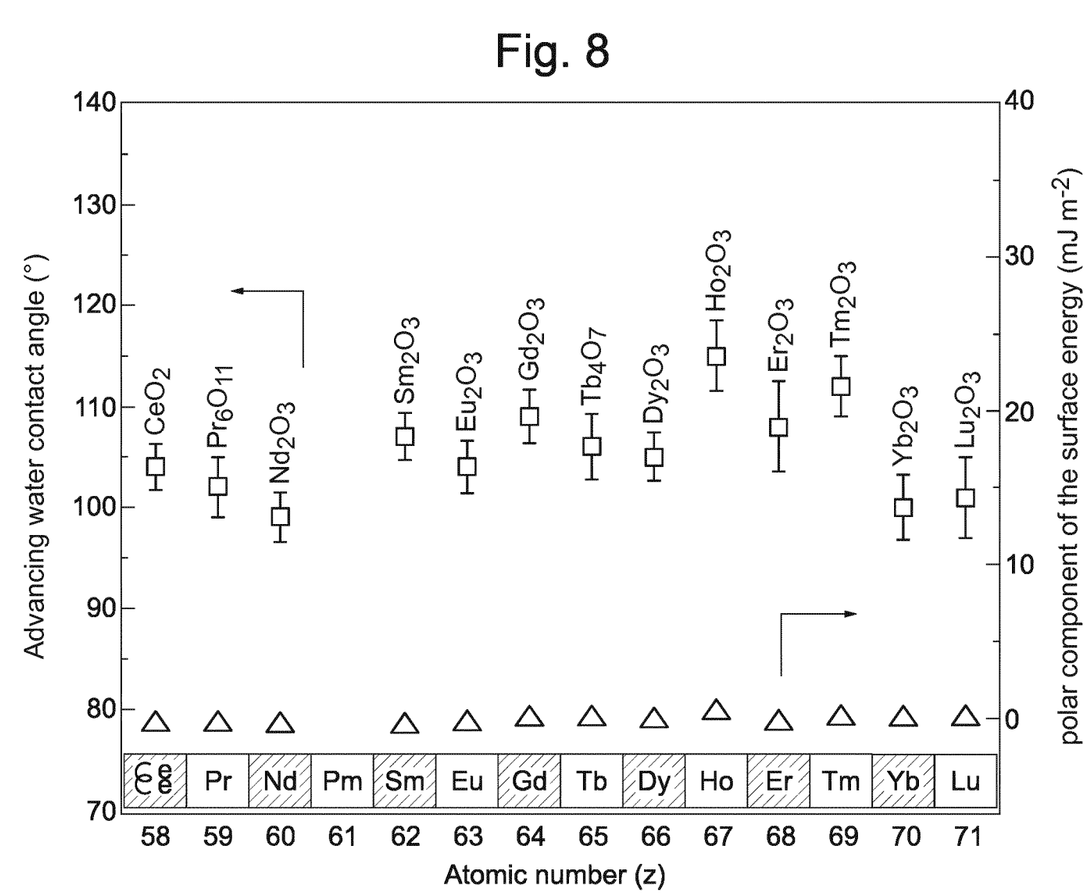
FIG. 8 illustrates the advancing water contact angle for rare earth element oxides.

FIG. 8 shows various different rare element oxides and their associated advancing water contact angle. The receding contact angle can be expected to be proportional to the advancing water contact angle. Therefore the most promising rare earth elements in terms of hydrophobicity are cerium, dysprosium, erbium, holmium, samarium and thulium and these rare earth elements are preferred. However any rare earth element is expected to exhibit hydrophobicity. Lanthanum and yttrium may be preferred as these are less expensive.

In a first embodiment the rare earth element is present in the outer layer 400 along with an inorganic and/or organosilicon polymer. One such example polymer is Lipocer and the present invention will be described with reference to Lipocer. However the invention is not limited to Lipocer and other inorganic and/or organosilicon polymers may be used, particularly those based on a Si—O—Si—O backbone like Lipocer.

Figure 6:
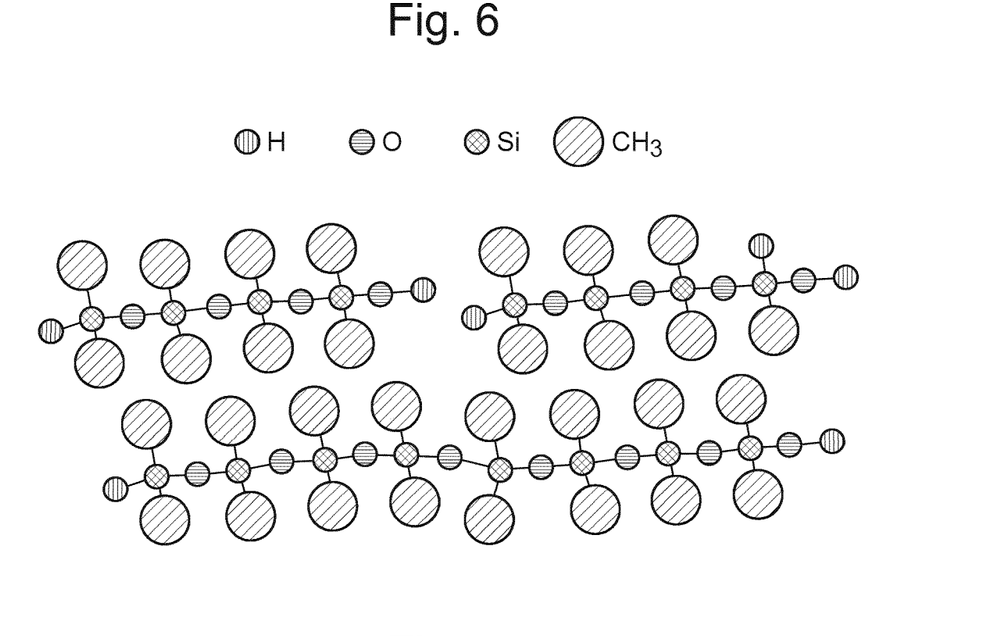
FIG. 6 illustrates the structure of Lipocer.
Figure 7:
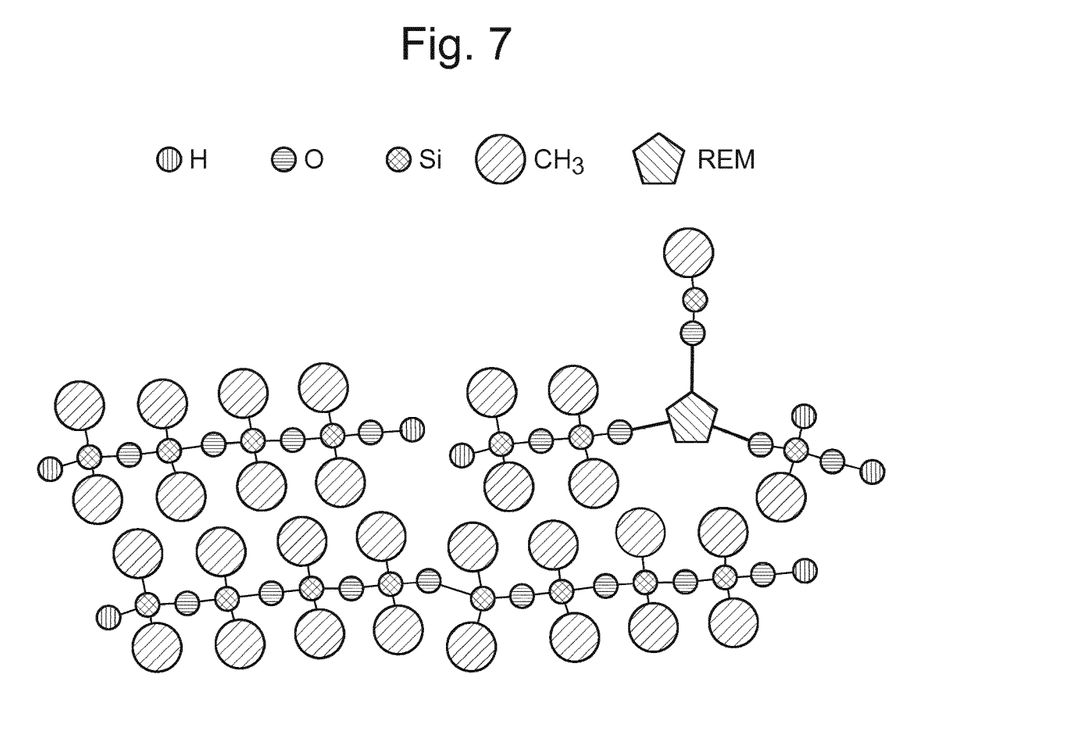
FIG. 7 illustrates the structure of Lipocer as modified in the present invention.

In an embodiment the rare earth element partial substitutes for Si in the Si—O—Si—O backbone. FIG. 6 shows a typical Lipocer structure and FIG. 7 shows how this structure is changed when a rare earth element (REM) is substituted for an Si atom in the backbone. As can be seen, the bond length between the rare earth element and oxygen is longer than the bond length between Si and oxygen. This contributes to the hydrophobicity.

Lipocer can be deposited in stages so that its bottom layer is most dense. In presence of significant amount of Oxygen in plasma, more $CH_3$ groups are removed and it is closer to pure SiO2 (Aquacer), otherwise more $CH_3$ groups stay attached and it is real Lipocer.

Initiation of plasma induced polymerization is shown above.

A possible plasma induced polymerization reaction of Lipocer from HMDSO is shown above.

The above chemical reactions (plasma induced polymerisation) illustrate that deposition in Oxygen-rich plasma lead to composition closer to $SiO_2$ (through removal of $CH_3$ groups).

In an embodiment the composition of the outer layer comprises rare earth element and an inorganic and/or organosilicon polymer, such as Lipocer. The resulting structure may be polymerized and/or mixed rare earth element. The outer layer may have a slightly reduced transparency compared to a pure Lipocer layer. In an embodiment the concentration of rare earth element in the outer later is between 0.1 atomic percent and 50 atomic percent. This ensures that enough rare earth element is present to improve the degradation performance of the outer layer but that not too much is present to reduce the transmission of the outer layer. Preferably the transmission (at normal incidence) of the outer layer is at least 50% of deep ultra violet radiation, more preferably at least 90%. In a preferred embodiment the concentration of rare earth elements in the outer layer is between 2.0 atomic percent and 30 atomic percent. Such a concentration has the best balance between improved degradation performance and high transmission of deep ultra violet radiation.

In an embodiment the rare earth element may be (co) deposited with Lipocer by sputtering a rare earth element target or using metal vapor arc source, for example a rare earth electrode. The target may be co-sputtered by the same or a different plasma source used in the polymer deposition or the metal vapor arc source can be engaged, at the same time as the polymer deposition or alternating with polymer deposition. In either case (co-deposition or alternate deposition) a structure similar to that in FIG. 7 is expected. The shallow depth of rare earth implants in polymers can be implied from the low energy of ions or atoms incident on the polymer.

In an embodiment the rare earth element may be deposited by physical vapour deposition (PVD) and/or chemical vapour deposition (CVD) and/or atomic layer deposition (ALD) techniques instead of sputtering or ion implantation. In PVD, CVD and ALD at least one of the precursors and/or reactive gases comprises the rare earth element to be deposited in the outer layer.

In an alternative method of deposition, during deposition of Lipocer which occurs in an oxidising plasma, as described above, a rare earth element compound in volatile form is introduced along with the Lipocer polymer precursor. A noble gas may also be included. Examples of rare earth element compounds in volatile form include trisacetylacetonates, chelates and other organometallic compounds. Such a deposition results in a structure such as illustrated in FIG. 7.

By selecting a suitable ratio of polymer to rare earth metal, it is possible to reduce the effect of aging of the polymer in terms of contact angle. That is, as the methyl groups are removed, the contact angle of the outer layer will be more and more driven by the presence of rare earth element-oxygen bonds than by the initial presence of methyl groups on the surface. Additionally, the self-healing properties of polymer may be improved. This is because the presence of the rare earth element in the backbone (see FIG.

7) leaves more space for adjacent methyl groups to rotate. Thereby the freedom of methyl groups to rotate to fill the gap of a methyl group which has been removed is improved. Thereby the self-healing properties of the polymer are improved.

In an embodiment, it might be beneficial to increase the amount of rare earth element thereby to change the optical or chemical properties of the outer layer. In an embodiment adding enough rare earth element may make the polymer more reflective for DUV radiation incident at grazing angle, or less prone to oxidation. Then the outer layer deterioration, driven by the scattered DUV in combination with UPW, that is for example outside of transmissive sensor marks, may be reduced.

In an embodiment Lipocer is replaced by $SiO_2$.

In an embodiment the outer layer is deposited in a way in which deposition of polymer or $SiO_2$ or $SiO_{2-x}$ and rare earth element is performed in multiple steps. The deposition of rare earth element and/or polymer or $SiO_2$ or $SiO_{2-x}$ may occur via sputtering, PVD, CVD and/or ALD or a combination thereof. Ideally the multiple deposition steps take place without exposing the layer to atmosphere, for example by maintaining a vacuum around the layer between deposition campaigns.

In an embodiment an inorganic or organosilicon polymer is deposited via plasma induced polymerization and/or $SiO_2$ or $SiO_{2-x}$ is deposited by sputtering or ALD.

Figure 9:
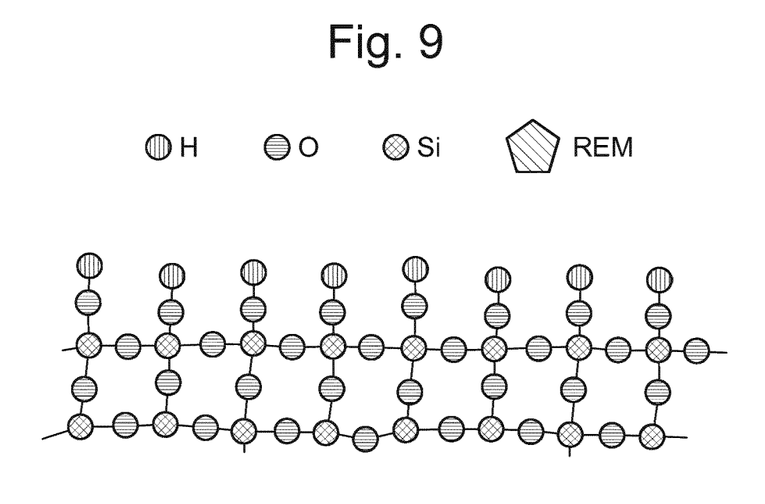
FIG. 9 illustrates the structure of $SiO_2$.
Figure 10:
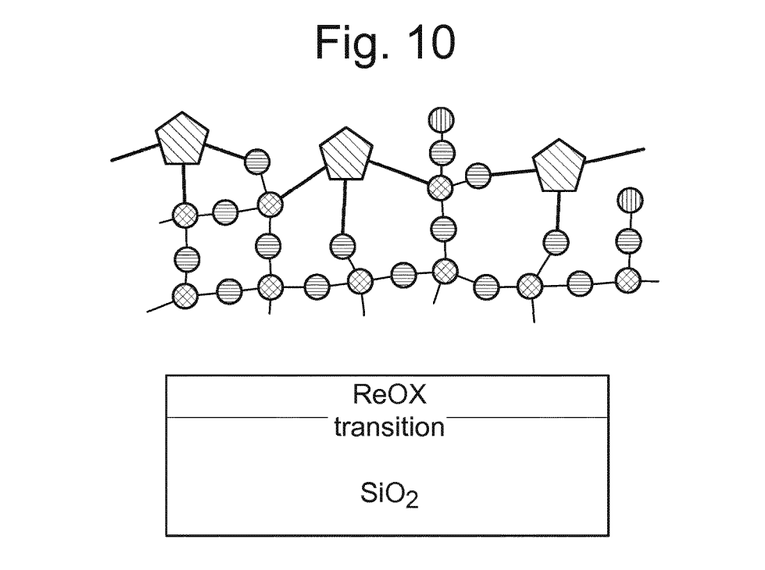
FIG. 10 illustrates the structure of $SiO_2$ as modified in the present invention.

In use (after exposure to air or UPW) $SiO_2/SiO_{2-x}$ layer deposited by sputtering or ALD becomes terminated by many —OH groups. This is illustrated in FIG. 9. Such a layer is hydrophilic (the —OH groups are polar and have a good aspect ratio to host water molecules). However such a layer is beneficial because it has good chemical properties and is robust against DUV irradiation in the presence of water. By adding rare earth element, the hydrophilicity will reduce without compromising the mechanical and chemical properties. Such a structure is illustrated in FIG. 10. Thus the outer layer can be seen as being comprised of a rare earth element oxide (and, by extension, boride, nitride, carbide, silicide).

In an embodiment after depositing the $SiO_2$ layer by sputtering or preferably ALD, rare earth element is deposited. Alternatively the structure may be achieved either by co-depositing, e.g. co-splluttering, the $SiO_2$ with rare earth element.

A sufficiently thin layer of rare earth element oxide (for example 1-30 nm) is transparent and does not distort DUV or visual radiation transmission.

In an embodiment a concentration gradient is set up through the thickness of the outer layer. For instance, the concentration of rare earth element increases as you move through the thickness of the outer layer away from the substrate. This can be achieved either by varying the concentration of rare earth element during co-deposition or by changing the time of various deposition steps in those embodiments where deposition of rare earth element is interspersed with deposition of another substance. Preferably the deposition is such that the concentration of rare earth element in an outer surface of the outer layer is greater than 10 atomic % as this will ensure a high enough level of hydrophobicity.

In a preferred embodiment, a layer of $SiO_2$ is deposited by ALD, followed by a layer of $SiO_2$ deposited by sputtering, followed by a transitional layer of sputtered $SiO_2$ and sputtered rare earth element oxide, followed by a final sputtered layer of rare earth element oxide.

In an embodiment, a ALD $SiO_2$ layer is followed by a sputtered $SiO_2$ layer, followed by a mixed layer of $SiO_2$ and ReOX deposited by sputtering. The concentration gradient may change in the mixed layer such that the concentration of rare earth element oxide on the outside of the mixed layer is highest.

In an embodiment no transitional layer is required so that the outer layer may comprise $SiO_2$ deposited by atomic layer deposition, $SiO_2$ deposited by sputtering and rare earth element oxide deposited by sputtering.

In an embodiment the rare earth element oxide is deposited by sputtering directly onto a $SiO_2$ layer deposited by atomic layer deposition. In such an embodiment the $SiO_2$ layer would have a thickness of 50-100 nm and the sputtered rare earth element oxide layer a thickness of less than 30 nm, preferably less than 10 nm.

Although the invention is described in relation to the outer layer 400 being formed on the lower layer 350 e.g., TiN, any other nitride with comparable properties can also be used (such as CrN, AlTiN, and TiAlN and ZrN, etc.). Additionally or alternatively a further layer, e.g. of $SiO_2$ may be formed between the lower layer 350 and the outer layer 400.

The invention is described above in relation to a sensor mark and a hydrophobic layer or a coating with limited hydrophilicity. However, the invention can be applied to other surfaces of a sensor as well as to objects other than a sensor (e.g. lens elements, support tables etc.).

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the clauses set out below. Other aspects of the invention are set out as in the following numbered clauses:

1. An immersion lithographic apparatus comprising:
   an object, the object comprising:
   a substrate and an outer layer, the outer layer, in use, coming in contact with immersion liquid,
   wherein the outer layer has a composition comprising a rare earth element.
2. The immersion lithographic apparatus of clause 1, wherein the composition further comprises an inorganic and/or organosilicon polymer.
3. The immersion lithographic apparatus of clause 2, wherein the polymer has a Si—O—Si—O backbone.
4. The immersion lithographic apparatus of clause 3, wherein a portion of the rare earth element partially substitutes for Si in the backbone.
5. The immersion lithographic apparatus of clause 2, 3 or 4, wherein the polymer has one or more groups selected from: methyl, ethyl, propyl, phenyl, vinyl.
6. The immersion lithographic apparatus of any of clauses 1-4, wherein the rare earth element is at least partially oxidized, nitridized, borodized, carbonized or siliciced.
7. The lithographic immersion apparatus of any one of clauses 1-6, further comprising an intermediate layer between the substrate and the outer layer.
8. The lithographic immersion apparatus of clause 7, wherein the intermediate layer comprises one or more of: SiO2, SiO2-x
9. The immersion lithographic apparatus of any of clause 7 or 8, wherein the intermediate layer has a thickness of between 1 nm and 1 µm, preferably of between 10 nm and 300 nm.
10. The immersion lithographic apparatus of any of clauses 1-9, wherein the outer layer has a concentration gradient of rare earth element through the layer thickness which increases as a distance from the substrate increases.
11. The immersion lithographic apparatus of any of clauses 1-10, wherein the rare earth element is present in an outer surface of the outer layer at the concentration (atomic percent) of 0.1 atomic % to 50 atomic %, preferably 2.0 atomic % to 30 atomic %.
12. The immersion lithographic apparatus of any of clauses 1-11, wherein the rare earth element is present in an outer surface of the outer layer at a concentration of greater than 10 atomic %.
13. The immersion lithographic apparatus of any of clauses 1-12, wherein the outer layer has a thickness of between 1 nm and 300 nm, preferably between 1 nm and 30 nm.
14. The immersion lithographic apparatus of any of clauses 1 to 13, comprising at least one patterned layer comprising a pattern of through holes and/or steps formed therein formed on the substrate and wherein the outer layer is formed over at least part of the patterned layer.
15. The immersion lithographic apparatus of any of clauses 1 to 14, further comprising a radiation blocking layer formed on the substrate under the outer layer.
16. The immersion lithographic apparatus of clause 15, wherein the radiation blocking layer comprises TiN.
17. The immersion lithographic apparatus of any one of clauses 1 to 16, wherein the outer layer is transmissive to deep ultraviolet radiation, with a transmission of the outer layer being at least 50%, preferably at least 90%.
18. The immersion lithographic apparatus of any one of clauses 1 to 17, wherein water makes a receding contact angle of at least 75°, preferably of at least 90° with the outer layer.
19. The immersion lithographic apparatus of any of clauses 1-18, wherein the object is a sensor.
20. The immersion lithographic apparatus of clause 19, wherein the sensor comprises a spatial transmission filter for deep ultra violet.
21. The immersion lithographic apparatus of clause 19 or 20, wherein the sensor is a transmission image sensor or an integrated lens interferometry sensor.
22. The immersion lithographic apparatus of any of clauses 1-19, wherein the object is a sensor mark.
23. The immersion lithographic apparatus of clause 22, wherein the sensor mark is a spatial reflective filter.
24. The immersion lithographic apparatus of clause 22 or 23, wherein the sensor mark is a sensor mark of an alignment sensor.
25. The immersion lithographic apparatus of any of clauses 1-24, wherein the rare earth element is one or more element from the group comprising: cerium (Ce), lanthanum (La), yttrium(Y), dysprosium (Dy), erbium (Er), holmium (Ho) samarium (Sm) thulium (Tm).
26. The immersion lithographic apparatus of any of clauses 1-25, wherein the outer layer, in use, is exposed directly or indirectly to deep ultra violet radiation.
27. An object for a lithographic apparatus comprising:
   a substrate and an outer layer, wherein
   water makes a receding contact angle of at least 75° with the outer layer; and
   the outer layer has a composition comprising a rare earth element.
28. A method of coating a substrate comprising:
   providing a substrate;
   depositing on the substrate an outer layer which has a composition comprising a rare earth element by at least one of:
   (a) sputtering, wherein at least one sputtering target material comprises rare earth element, and
   (b) PVD and/or CVD and/or ALD, wherein at least one of precursors/reactive gases comprises rare earth element, and
   (c) plasma induced (co)polymerization, and
   (d) ion implantation, where ion source is metal vapour arc source, and vapor at least partly comprises rare earth.
29. The method of clause 28, wherein the deposition of the composition comprising rare earth element is preceded or alternates with deposition of either: (a) an inorganic/organosilicon polymer or (b) SiO2 or SiO2-x, such that the composition comprises the polymer or SiO2.
30. The method of clause 29, wherein the deposition of the composition comprising rare earth element is preceded or alternates with deposition an inorganic/organosilicon polymer by PVD and/or plasma induced polymerization such that the composition comprises the polymer.
31. The method of clause 29, wherein the deposition of the composition comprising rare earth element is preceded or alternates with deposition SiO2 or SiO2-x by sputtering or ALD, such that the composition comprises SiO2.
32. The method of clause 28, wherein deposition of the composition comprising rare earth element is deposition of polymerized, and/or co-polymerized and/or mixed rare earth element.
33. The method of clause 28 or 32, wherein the composition further comprises inorganic and/or organosilicon polymer deposited by PVD or plasma-induced polymerisation.
34. The method of any of clauses 28 to 33, wherein the rare earth element is at least partially oxidized, nitridized, borodized, carbonized or siliciced.

35. A method of coating a substrate comprising:
providing a substrate;
exposing the substrate to an oxidising atmosphere containing a compound of a rare earth element in volatile form and an inorganic/organosilicon polymer precursor thereby to deposit an outer layer on the substrate which comprises co-polymerized and/or covalently bonded inorganic monomers and a rare earth element.

The invention claimed is:

1. An immersion lithographic apparatus comprising:
an object, the object comprising:
a substrate and an outer layer,
wherein the outer layer has a composition comprising a rare earth element and an inorganic and/or organosilicon polymer, the composition, in use, coming in direct contact with immersion liquid of the immersion lithographic apparatus.

2. The immersion lithographic apparatus of claim 1, wherein the polymer has a Si—O—Si—O backbone.

3. The immersion lithographic apparatus of claim 1, wherein the polymer has one or more selected from: methyl, ethyl, propyl, phenyl, vinyl.

4. The immersion lithographic apparatus of claim 1, wherein the rare earth element is at least partially oxidized, nitridized, borodized, carbonized or silicized.

5. The immersion lithographic apparatus of claim 1, wherein the object further comprises an intermediate layer between the substrate and the outer layer.

6. The immersion lithographic apparatus of claim 5, wherein the intermediate layer comprises one or more selected from: $SiO_2$, $SiO_2$-x.

7. The immersion lithographic apparatus of claim 1, wherein the outer layer has a concentration gradient of rare earth element through the layer thickness which increases as a distance from the substrate increases.

8. The immersion lithographic apparatus of claim 1, wherein the rare earth element is present in an outer surface of the outer layer at the concentration (atomic percent) of 0.1 atomic % to 50 atomic %.

9. The immersion lithographic apparatus of claim 1, wherein the object comprises at least one patterned layer, comprising a pattern of through holes and/or steps formed therein, formed on the substrate and wherein the outer layer is formed over at least part of the patterned layer.

10. The immersion lithographic apparatus of claim 1, wherein the object further comprises a radiation blocking layer formed on the substrate under the outer layer.

11. The immersion lithographic apparatus of claim 10, wherein the radiation blocking layer comprises TiN.

12. The immersion lithographic apparatus of claim 1, wherein the outer layer is transmissive to deep ultraviolet radiation, with a transmission of the outer layer being at least 50%.

13. The immersion lithographic apparatus of claim 1, wherein the object is a sensor.

14. The immersion lithographic apparatus of claim 1, wherein the rare earth element is one or more selected from: cerium (Ce), lanthanum (La), yttrium(Y), dysprosium (Dy), erbium (Er), holmium (Ho), samarium (Sm), thulium (Tm).

15. An object for a lithographic apparatus, the object comprising:
a substrate and an outer layer,
wherein water makes a receding contact angle of at least 75° with the outer layer, and
wherein the outer layer has a composition comprising a rare earth element, the composition, in use, coming in direct contact with the water.

16. The object of claim 15, wherein the composition further comprises an inorganic and/or organosilicon polymer.

17. The object of claim 15, wherein the rare earth element is at least partially oxidized, nitridized, borodized, carbonized or silicized.

18. A method of coating a substrate, the method comprising:
providing a substrate; and
depositing on the substrate an outer layer which has a composition comprising a rare earth element by at least one selected from:
(a) sputtering, wherein at least one sputtering target material comprises the rare earth element,
(b) PVD and/or CVD and/or ALD, wherein a precursor gas and/or a reactive gas comprises the rare earth element,
(c) plasma induced (co)polymerization, and/or
(d) ion implantation, where an ion source is a metal vapor arc source, and the vapor at least partly comprises the rare earth element,
wherein the composition, in use, comes in direct contact with liquid and water is able to make a receding contact angle of at least 75° with the outer layer.

19. The method of claim 18, wherein the deposition of the composition comprising the rare earth element is preceded or alternates with deposition of either: (a) an inorganic/organosilicon polymer or (b) $SiO_2$ or $SiO_{2-x}$, such that the composition comprises the polymer or $SiO_2$.

20. A method of coating a substrate, the method comprising:
providing a substrate;
exposing the substrate to an oxidising atmosphere containing a compound of a rare earth element in volatile form and an inorganic/organosilicon polymer precursor so as to deposit an outer layer on the substrate, which comprises co-polymerized and/or covalently bonded inorganic monomer and a rare earth element.

* * * * *